(12) United States Patent
Mahler et al.

(10) Patent No.: US 7,705,436 B2
(45) Date of Patent: Apr. 27, 2010

(54) SEMICONDUCTOR DEVICE WITH SEMICONDUCTOR CHIP AND METHOD FOR PRODUCING IT

(75) Inventors: Joachim Mahler, Regensburg (DE); Alfred Haimerl, Sinzing (DE); Angela Kessler, Sinzing (DE); Michael Bauer, Nittendorf (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 273 days.

(21) Appl. No.: 11/834,262

(22) Filed: Aug. 6, 2007

(65) Prior Publication Data

US 2009/0039484 A1 Feb. 12, 2009

(51) Int. Cl.
*H01L 23/495* (2006.01)
(52) U.S. Cl. .................. 257/676; 257/690; 257/778; 438/111; 438/123
(58) Field of Classification Search .............. 257/676, 257/690, 778, E21.506, E23.031; 438/111, 438/123
See application file for complete search history.

(56) References Cited

U.S. PATENT DOCUMENTS

| 4,646,129 | A | 2/1987 | Yerman et al. |
| 5,139,972 | A | 8/1992 | Neugebauer et al. |
| 6,040,626 | A | 3/2000 | Cheah et al. |
| 6,812,553 | B2 | 11/2004 | Gerbsch et al. |
| 6,841,421 | B2 | 1/2005 | Aono et al. |
| 7,091,595 | B2* | 8/2006 | Fuergut et al. ............. 257/687 |
| 7,095,098 | B2 | 8/2006 | Gerbsch et al. |
| 7,154,046 | B2* | 12/2006 | Chung ..................... 174/259 |
| 2004/0063240 | A1 | 4/2004 | Madrid et al. |
| 2006/0038265 | A1 | 2/2006 | Oberlin et al. |
| 2007/0085201 | A1 | 4/2007 | Bauer et al. |
| 2007/0094982 | A1* | 5/2007 | Beer et al. .................. 52/578 |
| 2007/0096274 | A1 | 5/2007 | Pavier et al. |
| 2008/0146010 | A1* | 6/2008 | Hosseini et al. ............ 438/575 |
| 2008/0224323 | A1* | 9/2008 | Otremba .................... 257/778 |
| 2009/0109645 | A1* | 4/2009 | Kreutzer et al. ............ 361/820 |

FOREIGN PATENT DOCUMENTS

| JP | 2003229527 | 8/2003 |
| WO | 2006003126 A1 | 1/2006 |
| WO | 2006021191 A1 | 3/2006 |

* cited by examiner

*Primary Examiner*—Phuc T Dang
(74) *Attorney, Agent, or Firm*—Edell, Shapiro & Finnan, LLC (57) ABSTRACT

A semiconductor chip has at least one first contact and one second contact on its top side and has connecting elements which are arranged jointly on a structure element and which connect the first contact and the second contact of the top side of the semiconductor chip to the external contacts.

37 Claims, 5 Drawing Sheets

SEMICONDUCTOR DEVICE WITH SEMICONDUCTOR CHIP AND METHOD FOR PRODUCING IT

BACKGROUND

The invention relates to a semiconductor device having a semiconductor chip, and to a method for producing it.

A semiconductor chip is typically provided as a component of a semiconductor device having external contact areas and a housing. The semiconductor chip is arranged within the housing, such that the housing protects the semiconductor chip.

The external contact areas of the semiconductor device enable functional access to the semiconductor chip outside the housing. Consequently, the semiconductor device has an electrically conductive redistribution wiring, which is arranged within the housing and electrically connects the contact area on the semiconductor chip to the external contact areas of the semiconductor device.

The semiconductor device also typically has a circuit carrier, which provides the external contact area and on which the semiconductor chip is mounted. The circuit carrier can be a leadframe or a wiring substrate. The contact areas of the semiconductor chip are electrically connected to internal contact areas of the circuit carrier via inner connecting elements. Said inner connecting elements can be bonding wires or flip-chip contacts in the form of solder balls. The circuit carrier and the inner connecting elements provide the inner redistribution wiring of the semiconductor device.

SUMMARY

In one embodiment, the invention provides a semiconductor device having a semiconductor chip. The semiconductor chip has at least one first contact and one second contact on its top side. The semiconductor device has a structure element with connecting elements arranged jointly on the structure element. The connecting elements connect the first contact and the second contact of the top side of the semiconductor chip to the external contacts of the semiconductor device.

The invention will now be explained in more detail with reference to the accompanying figures.

DETAILED DESCRIPTION

Figure 1:
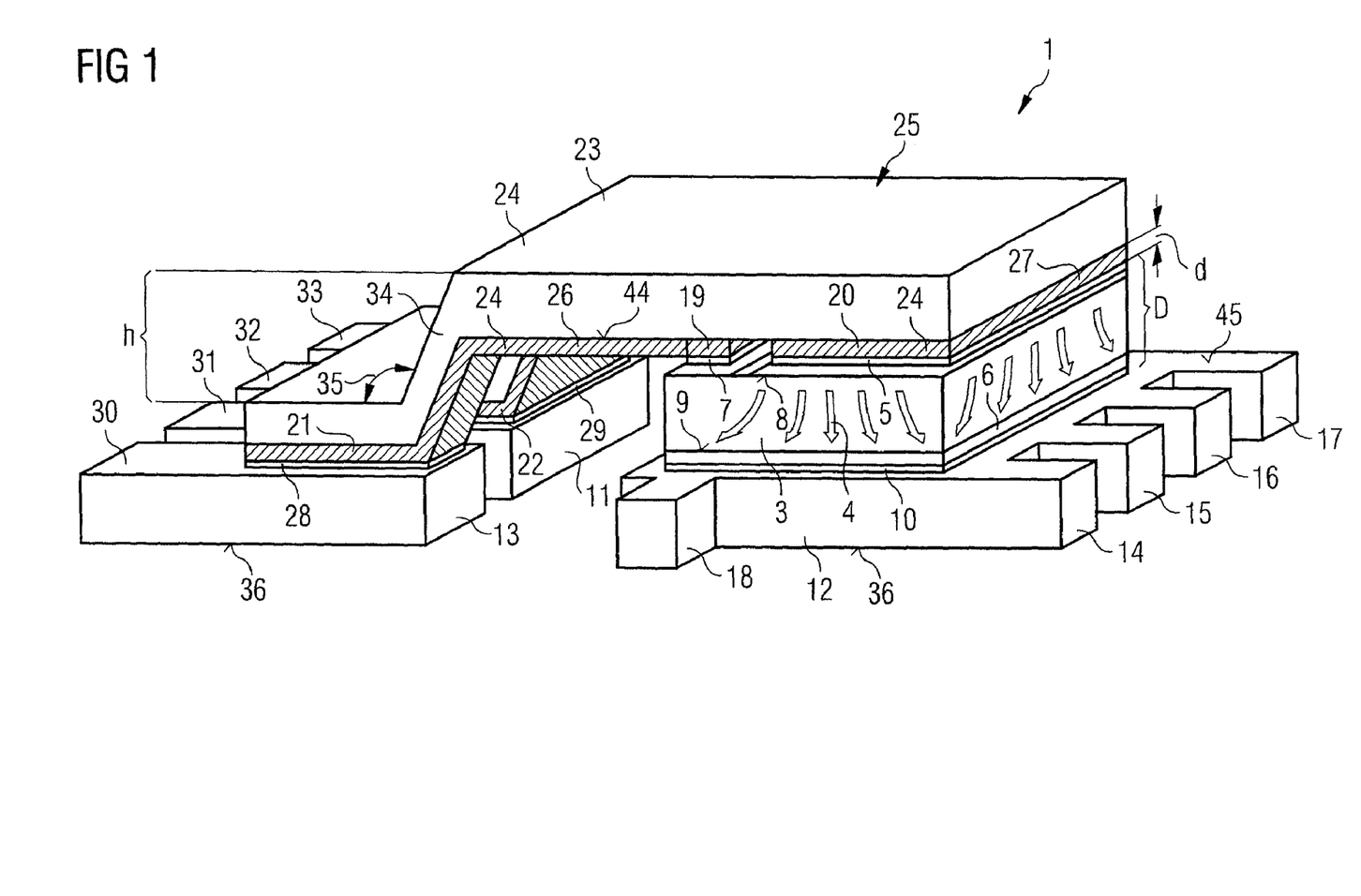
FIG. 1 shows a schematic perspective view of a semiconductor device in accordance with one embodiment of the invention.

FIG. 1 shows a schematic perspective view of a semiconductor device 1 in accordance with one embodiment of the invention. In this perspective illustration, the housing has been omitted in order to show the components of the semiconductor device 1. The semiconductor device 1 is constructed on planar leads 11, 12 and 13. For this purpose, the lead 12 has a contact pad 10 on its top side 45, the areal extent of which corresponds to a power electrode 6 on the rear side 9 of a semiconductor chip 3. Moreover, the lead 12 has the external contacts 14, 15, 16, 17 and 18, which are freely accessible on the underside 36 of the semiconductor device 1 and can additionally be contact-connected on the edge sides (not shown here) of the semiconductor device 1.

A further lead 11 likewise has a large-area contact pad 29 for connection to a power electrode 5, wherein the external contacts 31, 32 and 33 are accessible both from the underside 36 and from an edge side of the semiconductor device 1. The third lead 13 is provided for the connection of a control electrode 7 and has a contact pad 28. This lead 13 also has an external contact 30, which is surface-mountable onto a superordinate circuit board both from the underside 36 and from the edge side of the semiconductor device 1. A semiconductor chip 3 is arranged by its rear side 9 on the contact pad 10 of the lead 12, wherein the rear side 9 has a power electrode 6, which is electrically connected to the lead 12 either by means of a conductive adhesive or by means of diffusion solder layers or by means of a simple solder layer or by means of a low-temperature connection in particular by means of sintering processes of nanoparticles.

On the top side 8, the semiconductor chip 3 has a large-area power electrode 5 and a control electrode 7. Both electrodes 5 and 7 are electrically connected to a structured coating 27 having a thickness d of a structure element or of a connecting clip 25, which has an insulating base part 23, wherein the structured coating 27 of the structure element has four contact areas 19, 20, 21 and 22 connected via conductor tracks 26 of the structured coating 27. The insulating base part 23 of the connecting clip 25 is self-supporting and dimensionally stable and has a step 34, for example, which, with its obtuse-angled shoulder 35, overcomes the height difference between the electrodes 5 and 7 of the top side 8 of the semiconductor chip 3 and the leads 11 and 13. For this purpose, the step height h corresponds to the thickness D of the semiconductor chip 3.

When a control voltage is applied to the external contact 30, the semiconductor chip 3 is activated via the control electrode 7, such that a vertical current path 4 is formed from the power electrode 5 on the top side of the semiconductor chip 3 to the power electrode 6, via which current path a current flows from the external contacts 31 to 33 of the lead 11 to the external contacts 14 to 18 of the lead 12.

The construction of this semiconductor device 1 comprises, alongside the leads 11, 12 and 13, just two further components, namely the semiconductor chip 3 and the connecting clip or structure element 25, which have to be joined together during the assembly of the semiconductor device 1. Individual mountings of bonding wires, bonding tapes or other connecting elements can be obviated, such that only two joining steps, namely placing the semiconductor chip 3 onto the lead 12 and applying the connecting clip 25 to the semiconductor chip 3 and to the leads 11 and 13, have to be carried out. This is shown in detail in the subsequent FIGS. 2 to 7.

The semiconductor device thus has the structure element 25, on which is arranged at least one part of the inner redistribution wiring of the first contact and also of the second contact. At least two different inner redistribution wirings that are electrically isolated from one another are provided on a structure element 25. This has the advantage that at least two connections can be produced by the application of a single structure element 25. The first contact and also the second contact can be electrically connected to the external contacts of the semiconductor device in one method step. Production is simplified by comparison with a serial bonding wire method.

The electrically conductive redistribution wiring of the two contacts can be arranged on one side of an electrically insulating structure element 25. The connecting elements 24 can be provided in the form of contact areas and conductor tracks. In one of the embodiments, the structure element 25 is in one piece.

The structure element 25 can be produced from a DCB (direct copper bonded) material. A DCB material of this type has a ceramic plate which comprises aluminum oxide and/or aluminum nitride and which is coated with copper on one side or on both sides. In order to realize the connecting elements, the DCB material has a structured copper layer having a thickness d in micrometers of between $100\ \mu m \leq d \leq 600\ \mu m$. This ceramic plate ensures that the structure element is potential-free and enables high electrical insulation. The structured copper coating in turn has the advantage that it is possible to dispense with gold or aluminum wire bonding connections for a power semiconductor device.

Furthermore, the DCB material has, when based on aluminum oxide, a coefficient of thermal expansion of 7.1 ppm/K and, when based on aluminum nitride, a coefficient of thermal expansion of 4.1 ppm/K, such that, given suitable mixing of the ceramics of the DCB material, the coefficient of thermal expansion of the structure element can be adapted to the coefficient of thermal expansion of silicon. In this case, the structure of the copper layer on the structure element composed of DCB material is adapted to the structure of electrodes on the top side of a power semiconductor chip and thus has signal conductor tracks for the connection of a gate electrode and power conductor tracks for the connecting of a power electrode. Moreover, the top side of such conductor tracks of the structured copper layer can have a refining coating composed of nickel and/or nickel/gold.

The contact areas arranged on the underside of the structure element 25 can be densified to form a redistribution wiring structure with contact areas, wherein contact areas to the electrodes on the top side of the semiconductor chip are present at one end of the conductor tracks of the wiring structure and contact areas to the leads with external contacts are arranged on the other end of the conductor tracks.

In one embodiment, the structure element 25 extends between the top side of the semiconductor chip and at least two external contacts. The external contacts can be electrically connected to one another, thereby enabling access to a contact of the semiconductor chip via two external contacts. This is advantageous in power semiconductor devices since the load contacts carry high currents.

In a further embodiment, the structure element 25 extends between the top side of the semiconductor chip and at least two separate external contacts. Separate external contacts are understood to mean external contacts which are not electrically connected to one another. The structure element extends between the external contact of the first contact and the external contact of the second contact and also between the external contacts and the semiconductor chip.

In one embodiment, the structure element 25 has a coefficient of thermal expansion of less than 10 ppm/K, preferably less than 6 ppm/K. The difference between the coefficients of thermal expansion of the structure element and of the semiconductor chip is reduced in comparison with a metallic structure element. This increases the reliability of the semiconductor device since the shear stresses on the connection between the contact areas of the structure element and the contacts on the top side of the semiconductor chip are reduced.

Preferably, the structure element 25 has a preformed base part composed of plastic, which has insulating fillers and the coefficient of thermal expansion of which is adapted to the coefficient of thermal expansion of the semiconductor material of the semiconductor chip. This insulated base part makes it possible to arrange a multiplicity of contact areas and conductor tracks on the underside of said base part in the form of a conductive structured coating, such that only an individual joining step is necessary for cohesively connecting the contact areas to the electrodes of the top side of the semiconductor chip and the contact pads of the external contacts.

In a further embodiment of the invention, the structure element 25 has a preformed base part composed of sintered ceramic, the coefficient of thermal expansion of which is adapted to the coefficient of thermal expansion of the semiconductor material of the semiconductor chip. In the case of such a base part composed of ceramic material, too, it is possible to arrange a multiplicity of contact areas and conductor tracks on the underside of the connecting clip in order to produce the connection to the top side of the semiconductor chip and to the corresponding external contacts of the semiconductor device in a single joining step. The adaptation of the coefficient of thermal expansion of the base part to the coefficient of thermal expansion of the semiconductor material of the semiconductor chip that is striven for in both cases advantageously increases the reliability of the semiconductor device since shear stresses on the cohesive connection between contact areas of the structure element and the contacts on the top side of the semiconductor chip are minimized.

Preferably, the cross section of the conductor tracks is adapted to the current density that flows via the contacts, in particular via power electrodes. In this case, a permissible current density and a permissible heating of the conductor tracks are not exceeded, so as to avoid destruction of the conductor track connections. In this case, the cross section also depends on the resistivity of the coating material used. Preferably, the coating of the base part has a metal or an alloy from the group Cu, Al, Ag, Au, Pd, Pt or Ni. These materials require different coating thicknesses and coating methods for carrying current between contacts on the top side of the semiconductor chip and the contact pads on the external contacts, particularly when said metals and metal alloys tend toward forming oxide or sulfide layers when stored in air.

The external contacts preferably form surface-mountable, flat external contacts on the underside of the semiconductor device, while the top sides of the external contacts have contact pads connected cohesively to the connecting clip. In this case, the external contacts can be accessed both from the underside of the semiconductor device and from the edge sides of the semiconductor device.

In order to cohesively connect the structure element 25 both to the contacts of the top side of the semiconductor chip and to the contact pads on the external contacts only by one production step, the structure element has two contact connection planes, which are arranged, on the one hand, at the level of the contact pads of the external contacts and, on the other hand, at semiconductor chip height, for connection to top side contacts of the semiconductor chip. The height difference between the contact connection plane of the external contacts and the top side of the semiconductor chip can be overcome by means of a step in the structure element. Said step can have a right-angled or else obtuse-angled shoulder, wherein the height of the shoulder is adapted to the thickness of the semiconductor chip. Furthermore, it is also possible to use a planar connecting plate as structure element 25 and to preform the external contacts for thickness compensation in the semiconductor device.

In a further embodiment of the invention, the contacts of the top side of the semiconductor chip and/or the contact areas of the structure element have coatings with diffusion solder components for forming intermetallic phases. If the semiconductor chip has a third contact on its rear side, the semiconductor device can have at least one diffusion solder layer between the third contact of the semiconductor chip and an associated chip carrier or lead with external contacts.

A diffusion solder connection of this type has the advantage that the melting point of the diffusion solder material is lower than the melting point of the intermetallic phases that form during the diffusion soldering process in the diffusion solder layer. Intermetallic phases of this type preferably belong to the group AuSn, AgSn, CuSn and/or AgIn.

In one exemplary embodiment, a semiconductor device having a vertical semiconductor chip, such as a vertical transistor for example, is specified, wherein the structure element is provided according to one of the embodiments described above in the form of a connecting clip and the external contacts are provided in the form of leads. A third contact is arranged on the rear side of the semiconductor chip.

The semiconductor chip has at least one vertical current path between power electrodes, which is switched by a control electrode. The control electrode and a first power electrode are arranged on the top side of the semiconductor chip. A second power electrode covers the rear side of the semiconductor chip. The semiconductor chip is arranged with the second power electrode on a contact pad of an individual lead having external contacts. The control electrode and the first power electrode are electrically connected via contact areas of connecting elements to separate leads having inner contact pads and outer external contacts. A common connecting clip in one piece, which has different contact areas, electrically connects the electrodes of the top side of the semiconductor chip to the contact pads of the separate leads.

This semiconductor device has the advantage that planar leads can be used, and that the number of connecting elements with their high mounting risk is reduced to a single connecting element in the form of a connecting clip and a plurality of top side electrodes of the semiconductor chip are nevertheless reliably connected to corresponding leads. The current conductivity is not limited by the cross section of bonding wires or bonding tapes, nor is it limited by the cross section of a connecting element, but rather can be optimized by a coating of the connecting clip that can be adapted in terms of its thickness to the current-carrying capacity, wherein the electrically conductive coating extends from the top side electrodes to the leads and overall increases the current conductivity of the dimensionally stable connecting clip on account of high current conductivity.

In one embodiment of the invention, the connecting clip has further contact areas for signal and/or supply electrodes of the top side of the semiconductor chip, wherein said signal and/or supply electrodes interact with monolithically integrated control or logic circuits of the semiconductor chip. The advantages of the connecting clip in one piece are manifested particularly in this embodiment of the invention. The contact areas arranged on the underside of the connecting clip can be densified to form a redistribution wiring structure with contact areas, wherein contact areas to the electrodes on the top side of the semiconductor chip are present at one end of the conductor tracks of the wiring structure and contact areas to the leads with external contacts are arranged on the other end of the conductor tracks.

In a further embodiment of the invention, the electrodes of the top side of the semiconductor chip and/or the contact areas of the connecting clip have coatings with diffusion solder components for forming intermetallic phases. For this purpose, the semiconductor device has at least one diffusion solder layer between the second power electrode of the semiconductor chip and the associated lead with external contacts.

Such a diffusion solder connection has the advantage that the melting point of the diffusion solder material is lower than the melting point of the intermetallic phases that form during the diffusion soldering process in the diffusion solder layer. Such intermetallic phases preferably belong to the group AuSn, AgSn, CuSn and/or AgIn.

The control electrode is preferably an insulated gate electrode. Although the gate electrode has a smaller area than the power electrodes, it is nevertheless connected with the same coating as the power electrode in order to ensure the common contact connection planes both at the surface level of the semiconductor chip and at the top side level of the leads. The power MOSFET, for its part, can have a monolithically integrated gate driver, whereby the number of signal and supply electrodes on the top side of the semiconductor chip and thus also the complexity of the connecting clip are significantly increased.

In a further embodiment of the invention, the first power electrode is an emitter electrode and the second power electrode is a collector electrode of a vertical IGBT (insulated gate bipolar transistor), and the control electrode is in turn an insulated gate electrode. Said gate electrode can also be formed as a vertical trench gate electrode. The individual components of the semiconductor device, such as semiconductor chip, leads and connecting clip, can be arranged in a cavity housing, wherein external contacts of the leads are freely accessible on the underside and/or the edge sides of the semiconductor device. Furthermore, it is possible to provide for these components also a plastic housing whilst leaving free external contacts of the leads on the underside and/or on the edge sides of the semiconductor device and/or whilst leaving free a top side of the structure element 25 on the top side of the semiconductor device in a plastic housing composition.

In one embodiment, the semiconductor device has a chip carrier having a top side and a rear side, wherein the semiconductor chip is arranged on the top side of the chip carrier. The chip carrier can be provided as part of a leadframe. If the semiconductor device has a plastic housing, the rear side of the chip carrier can be accessible freely from the plastic housing composition. The rear side of the chip carrier can form an external contact of the semiconductor device which lies in the same plane of the other external contacts.

FIGS. 2 to 7 show schematic views of components for producing a semiconductor device in accordance with FIG. 1.

Figure 2:
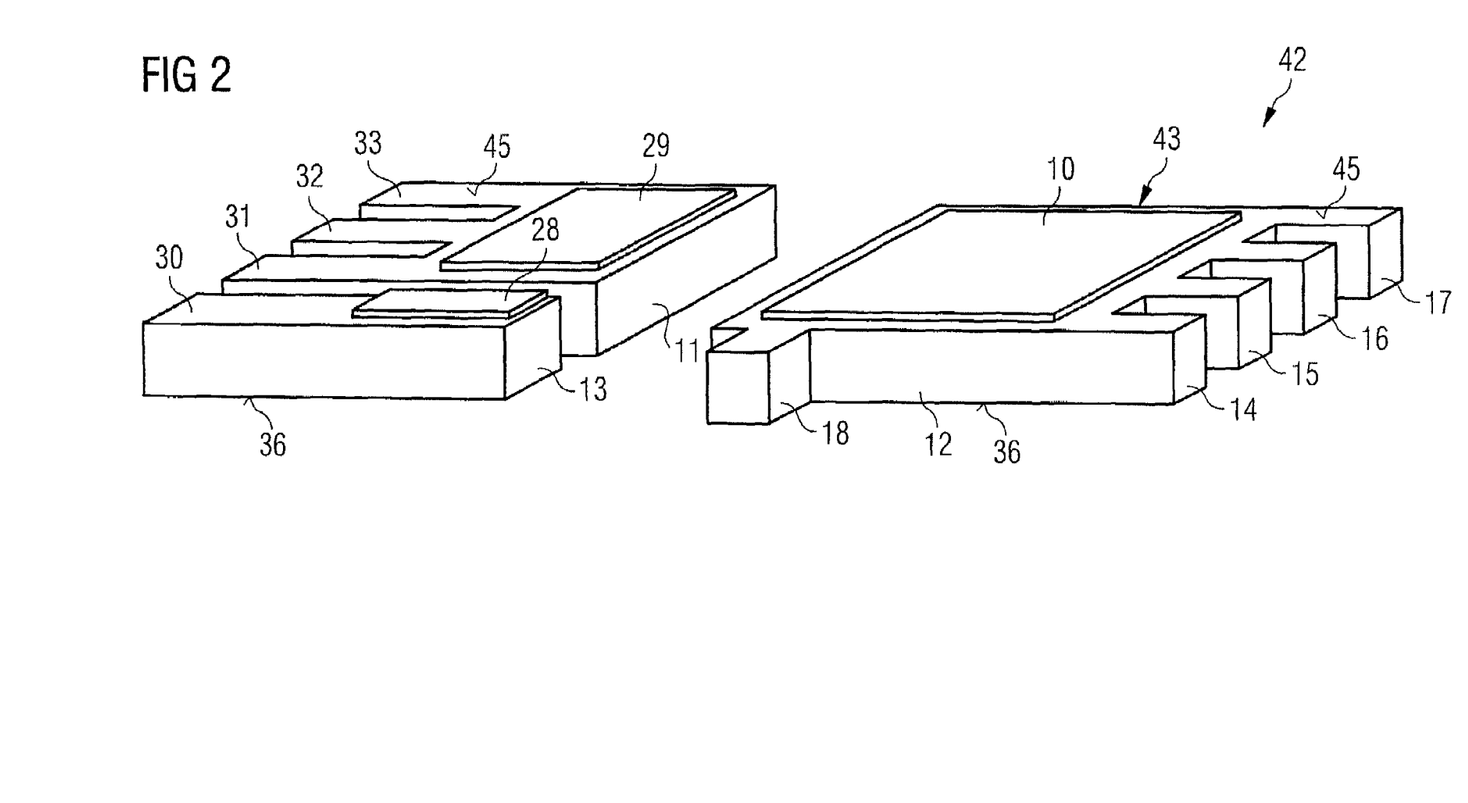
FIG. 2 shows a schematic perspective view of a semiconductor device position of a leadframe.

FIG. 2 shows a schematic perspective view of a semiconductor device position 43 of a leadframe 42. In this semiconductor device position, the leads 11, 12 and 13 are arranged in a manner spaced apart from one another and have the contact pads 10, 28 and 29 on their top sides 45, wherein the contact pads 10 and 29 are prepared for receiving large-area connections. At the same time, the leads 11, 12 and 13 are provided with external contacts on the underside 36 and the edge sides, wherein the lead 12 has the external contacts 14 to 18 and the lead 11 has the external contacts 31 to 33 and the lead 13 has the external contact 30.

Figure 3:
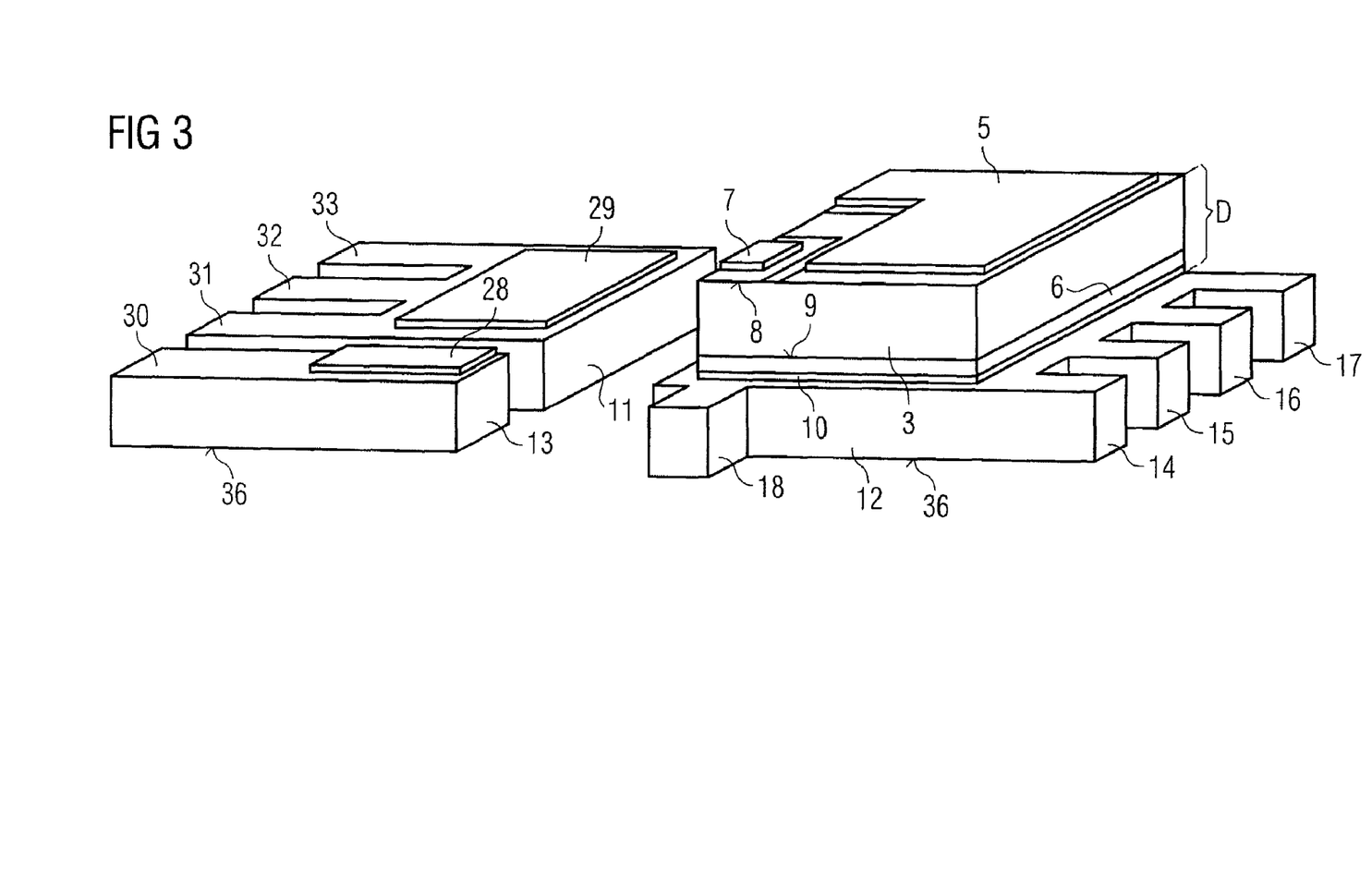
FIG. 3 shows a schematic perspective view of the semiconductor device position after the application of a semiconductor chip.

FIG. 3 shows a schematic perspective view of the semiconductor device position 43 after the application of a semiconductor chip 3 with the power electrode 6 arranged on its rear side 9 onto the contact pad 10 of the lead 12. The semiconductor chip 3 has a thickness D, such that the power electrode 5 and the control electrode 7 on the top side 8 of the semiconductor chip and the associated contact pads 28 and 29 on the leads 13 and 11, respectively, are to be connected via correspondingly offset connecting tracks to the electrodes 5 and 7—located at a higher level—of the top side 8 of the semiconductor chip 3. Instead of a plurality of connecting elements, FIGS. 4 to 6 show an individual connecting clip 25, which makes it possible to connect the electrodes 5 and 7 of the top side 8 of the semiconductor chip to the contact pads 28 and 29 of the leads 11 and 13 by means of a single joining step.

Figure 4:
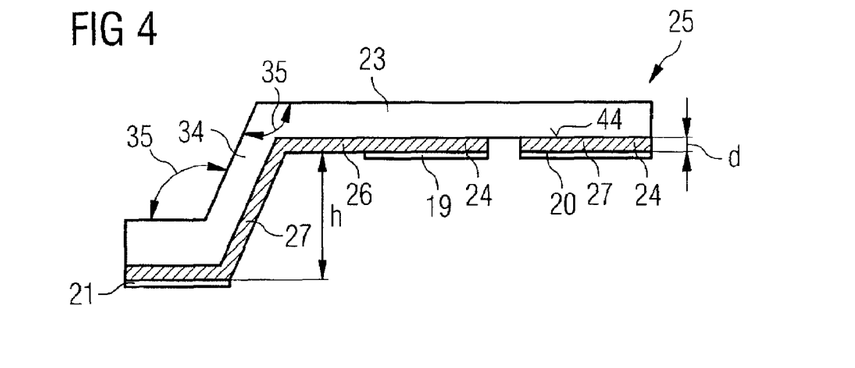
FIG. 4 shows a schematic side view of a connecting clip.

For this purpose, FIG. 4 shows a schematic side view of a connecting clip 25. The connecting clip 25 comprises an insulating base part 23, which comprises a filled plastic or a sintered ceramic and has for example a step 34 having a step height h, which can overcome the height difference shown in FIG. 3 between the electrodes 5 and 7 of the top side 8 of the semiconductor chip 3 and the contact pads 28 and 29 of the leads 11 and 13. In this embodiment of the connecting clip 25, the step 34 has an obtuse-angled shoulder 35. A structured coating 27 having a thickness d is arranged on the underside 44 of the base part 23. The coating 27 has two conductor tracks 26, at the ends of which are arranged contact areas, for example 19 and 21.

Figure 5:
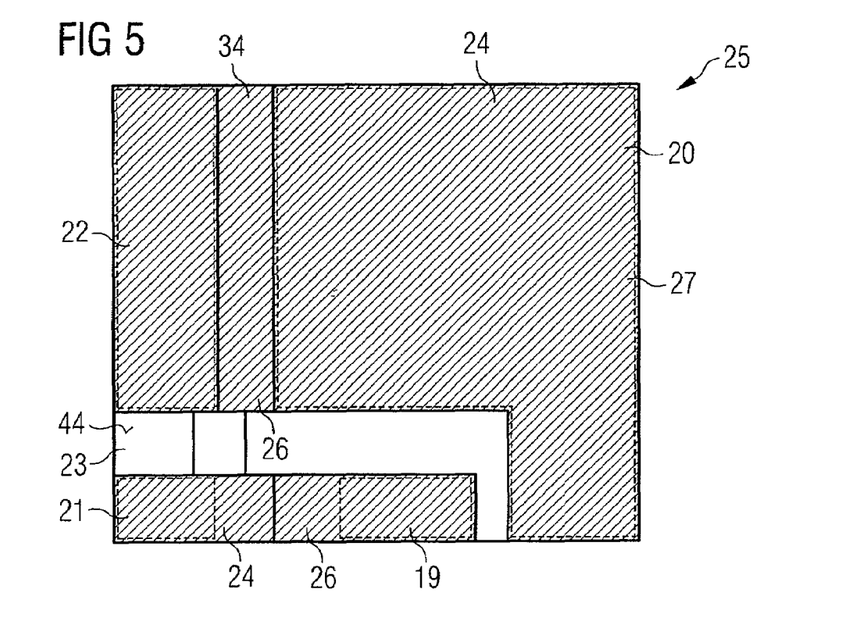
FIG. 5 shows a schematic bottom view of the connecting clip from FIG. 4.

FIG. 5 shows a schematic bottom view of the connecting clip 25 from FIG. 4, with two conductor tracks 26, wherein a narrow conductor track 26 connects the contact areas 19 and 21 for a control electrode to one another and a wider conductor track 26 connects the contact areas 20 and 22, and wherein the conductor tracks 26 are supported and held together by the base part 23.

Figure 6:
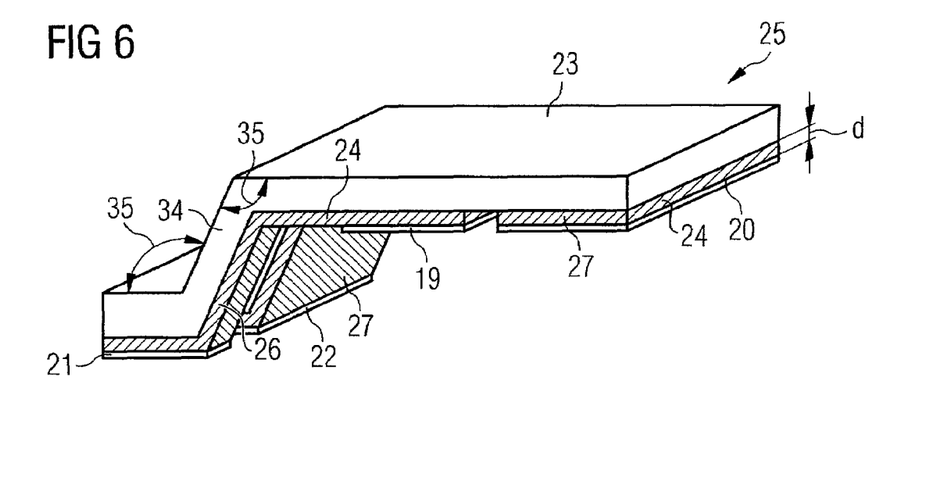
FIG. 6 shows a schematic perspective view of the connecting clip in accordance with FIG. 4.

FIG. 6 shows a schematic perspective view of the connecting clip 25 in accordance with FIG. 4, such that the arrangement of the four contact areas 19 to 22 becomes visible. This connecting clip 25 is subsequently applied to the assembly shown in FIG. 3 in a semiconductor device position 43.

Figure 7:
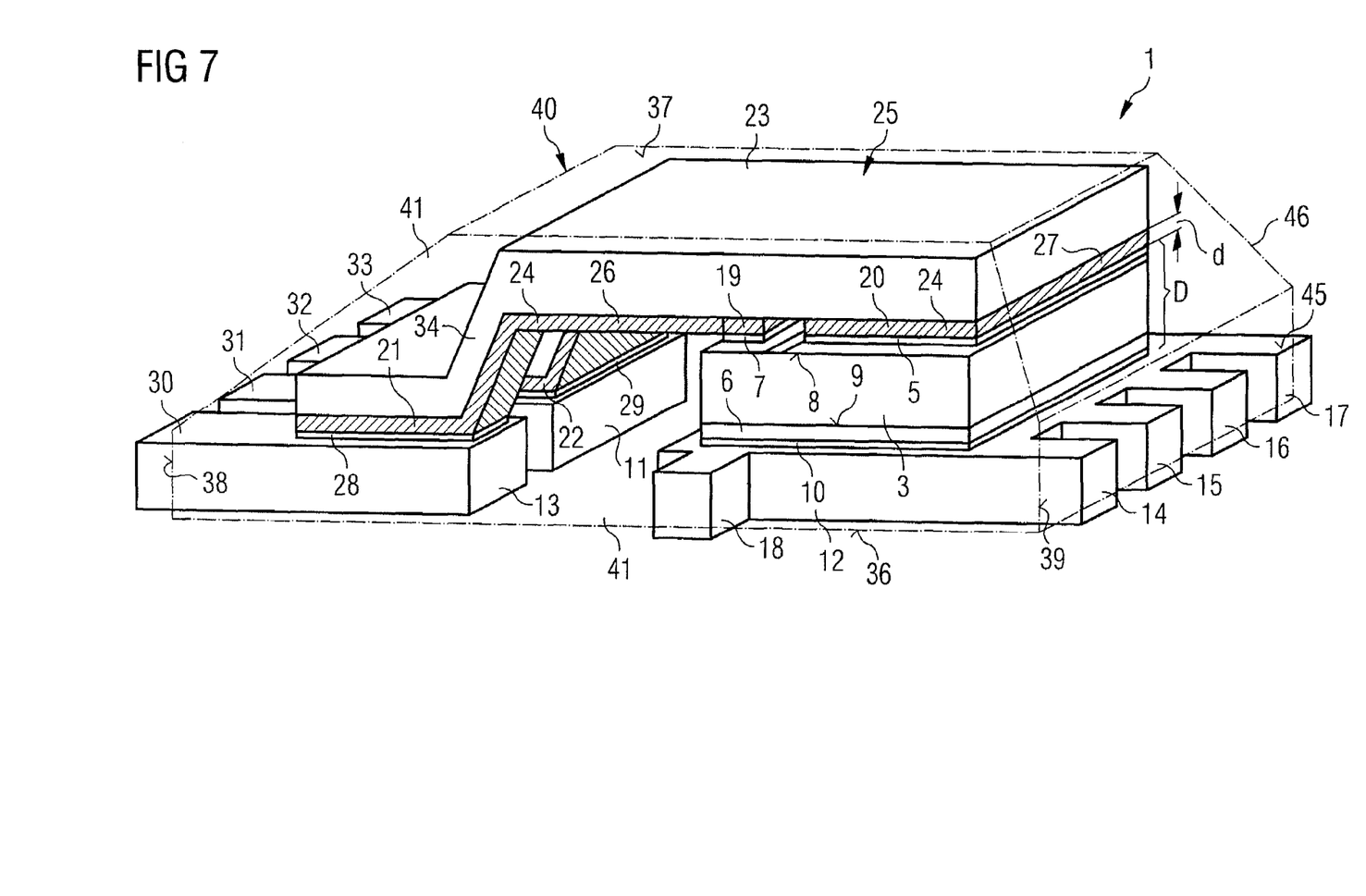
FIG. 7 shows a schematic perspective view of the semiconductor device position after the application of the connecting clip in accordance with FIG. 6.

FIG. 7 shows a schematic perspective view of the semiconductor device position 43 after the application of the connecting clip 25 in accordance with FIG. 6, such that the components of the semiconductor device are now completely joined together. This joining together is effected by means of surface mounting of the connecting clip 25 on the semiconductor chip 3 and on the leads 11 and 13 in a single joining step, wherein a conductive adhesive or a solder material can be used for the joining. The dash-dotted line 46 shows the contours of a plastic housing 40 composed of a plastic housing composition 41 into which are embedded the components of the semiconductor device 1 whilst leaving free the external contacts 14 to 18 and 30 to 33 on the underside 36 and the edge sides 38 and 39 of the semiconductor device 1. In this case, the top side 37 of the semiconductor device 1 covers the top side 47 of the base part of the connecting clip 25.

The method for producing a device accordingly has the following method steps. The first step involves providing at least one semiconductor chip having at least one first contact and one second contact on a top side, and also external contacts and a structure element having connecting elements. The structure element is applied to the semiconductor chip and to the external contacts and the first contact and the second contact are thereby connected to the external contacts.

In detail, the structure element is produced by firstly producing a self-supporting insulating base part, which has a filled plastic or a sintered ceramic, for example, which is subsequently provided with an electrically conductive coating on its underside. In this case, the thickness of said coating is adapted to the current loading of the semiconductor device and subsequently structured to form contact areas with conductor tracks arranged in-between. For this purpose, for the coating, metals from the group Cu, Al, Ag, Au, Pd, Pt or Ni can be deposited chemically or electrodeposited on an underside of the base part. The structuring can then be effected, after the application of a structured protective layer by means of screen printing, stencil printing or jet printing, by subsequent etching of the non-protected metal coating.

In order to produce a structure element composed of sintered ceramic material, firstly a green body is formed and is subsequently fired to form an insulating sintered ceramic part. In this case, care is taken to ensure that the coefficient of expansion of the base part is adapted to the coefficient of thermal expansion of the semiconductor material of the semiconductor chip. When using casting resin to produce such a base part, the casting resin is filled with particles which have the coefficient of thermal expansion of the semiconductor material, such that loadings by shear stresses are minimized.

The structure element is applied simultaneously in two contact connection planes, namely firstly between contact areas and the contacts of the top side of the semiconductor chip and secondly between contact areas and the contact pads of the external contacts. In this case, the contact areas of the structure element can be surface-mounted by means of soldering or adhesive bonding. During the application of the structure element, a diffusion solder material can also be applied in preparatory fashion to the contact areas of the structure element and diffusion soldering can subsequently be carried out at the corresponding diffusion soldering temperatures under contact pressure of the connecting clip onto the external contacts and the contacts of the top side of the semiconductor chip.

An injection molding technique or a transfer molding technique is used for packaging the semiconductor chips with structure element, wherein the structure element and semiconductor chip and top sides of the leads are embedded in a plastic housing composition and only the external contacts on the undersides and the edge sides of the semiconductor device are kept free of plastic composition. On the other hand, it is also possible to introduce the components of such a semiconductor device into a cavity housing after the application of the structure element.

This can be carried out repeatedly in each of the semiconductor device positions of a leadframe, wherein the leadframe is subsequently separated into individual semiconductor devices by means of laser separating technology or an etching method or by means of storing technology or stamping technology. The leadframe provides the external contacts of the semiconductor device, which external contacts can be in the form of a chip carrier and/or leads. The underside of the leadframe provides the external contact area of the device, while the top side of the leadframe provides of the inner contact area of the external contacts.

In one embodiment, the method is used to produce a plurality of semiconductor devices using lead technology with at least one vertical current path through a semiconductor chip. This method has the following method steps. The first step involves producing a semiconductor chip having a first power electrode and a control electrode on the top side and a second power electrode on the rear side of the semiconductor chip. In parallel with this, a leadframe with leads can be produced, which has inner contact pads and outer external contacts in a plurality of semiconductor device positions. Likewise in parallel with this, a structure element or a connecting clip according to one of the embodiments described above can be produced, which has different contact areas that are congruent with the electrodes of the top side and with the contact pads of the separate leads.

After these preparations for producing the semiconductor chips, the leadframe and the connecting clips, individual semiconductor chips are fixed in the semiconductor device positions whilst cohesively connecting the rear sides of the semiconductor chips to a contact pad of a central lead of the leadframe. Afterward, the connecting clip is cohesively connected to the electrodes of the top side of the semiconductor chip and the contact pads on the separate leads. The semiconductor chips with the connecting clip are then packaged in a housing in the semiconductor device positions and, finally, the leadframe is then separated into individual semiconductor devices.

Such a method has the following advantages:

1. As a result of the coating—structured in preparatory fashion—with an electrically conductive material on the underside of the insulating base part of the connecting clip or of the structure element, a "clip" is created which can connect a plurality of surface electrodes to corresponding contact areas of leads by means of a single surface mounting step.
2. A better process reliability is achieved by means of the method, especially as, in comparison with bonding, the connection by means of the connecting clip is stabler and such a connecting clip can be positioned optimally.
3. A further advantage resides in a low process temperature if the contact areas of the connecting clip are connected to the corresponding electrodes of the semiconductor chip and the contact pads of the leads by means of a conductive adhesive.
4. The risk of contamination such as may occur in the case of solder pastes, for example, is reduced in the case of the connecting process according to the invention, particularly in the case of a diffusion solder connection.
5. Furthermore, improved adhesion between the top side contact and the connecting clip is achieved by means of the electrically conductive structured coating and the reliability is increased if the coefficient of thermal expansion of the connecting clip is adapted to the coefficient of thermal expansion of the semiconductor chip.
6. As a result of structuring the electrically conductive coating, it is possible, by way of example, for the conductivity of the conductor tracks of the coating of the connecting clip to be adapted to the current-carrying capacity in a targeted manner with the aid of the coordination between length and width of the conductor tracks and corresponding thickness of the coating. It is also possible to create a redistribution wiring for the abovementioned electrodes, such that it is possible to completely dispense with a wire bonding process in a semiconductor device. For this purpose, the semiconductor chip can be equipped with a plurality of signal and control electrodes and also power electrodes on its top side.

A metal plate, preferably a planar copper plate, is structured for producing a leadframe with leads which have inner contact pads and outer external contacts in a plurality of semiconductor device positions. This is possible by virtue of the fact that, with the aid of the connecting clip, the electrodes of the top side of the semiconductor chip can be connected to such leads from a planar metal plate. Preferably, a stamping process or a dry or wet etching process is used for structuring the planar metal plate. The structuring can also be effected by means of laser removal.

An alternative method for producing a leadframe consists in electrodepositing or chemically depositing the lead structure on an auxiliary carrier and subsequently removing the auxiliary carrier.

The application of the semiconductor chip by its rear side onto a lead in one of the semiconductor device positions of the leadframe can be effected by means of soldering or by means of adhesive bonding, wherein a conductive adhesive can be used for electrical connection. On the other hand, it is also advantageous to apply diffusion solder layers composed of a diffusion solder material to the second power electrode on the rear side of the semiconductor chip and to the contact pad of the associated lead, said diffusion solder layers having at least one of the substances AuSn, AgSn, CuSn and/or InAg. Diffusion soldering of the layers which lie one on top of another and have been pressed onto one another is subsequently carried out at a diffusion soldering temperature $T_D$ of between $180°\ C.\leq T_D \leq 450°\ C$.

The semiconductor chips used are preferably MOSFETs in which a vertical drift path and a lateral gate structure and also a source electrode as first power electrode are arranged on the top side of the semiconductor chip, wherein the second electrode is formed by the drain electrode on the rear side of the semiconductor chip, and the semiconductor chip is applied by said rear side to a contact pad of a lead. Instead of MOSFETs, it is also possible to apply IGBT semiconductor chips (insulated gate bipolar transistor) which likewise have a vertical drift path and a lateral gate structure and also an emitter electrode as first power electrode on the top side, with a collector electrode on the rear side of the semiconductor chip, onto a contact pad of a lead.

Producing a connecting clip involves providing contact areas for connection to at least one power electrode and a control electrode in a contact area plane of the connecting clip. Furthermore, contact areas for signal and/or supply electrodes of monolithically integrated control and logic circuits can be provided on said contact plane of the connecting clip.

The invention claimed is:

1. A semiconductor device comprising:
   a semiconductor chip with at least one first contact and one second contact on its top side,
   external contacts, and
   connecting elements which are arranged jointly on a structure element and which connect the first contact and the second contact of the top side of the semiconductor chip to the external contacts,
   wherein leads form the external contacts which form surface-mountable flat external contacts of the semiconductor device.

2. The semiconductor device as claimed in claim 1, wherein each connecting element has two contact areas and a conductor track.

3. The semiconductor device as claimed in claim 1, wherein the semiconductor chip has a rear side, on which a third contact is arranged.

4. The semiconductor device as claimed in claim 1, wherein the structure element is in one piece.

5. The semiconductor device as claimed in claim 1, wherein the structure element comprises a DCB (direct copper bonded) material.

6. The semiconductor device as claimed in claim 5, wherein the DCB material comprises an aluminum-oxide- or aluminum-nitride-based ceramic plate coated with copper at least on one side.

7. The semiconductor device as claimed in claim 5,
wherein the DCB material comprises a structured copper layer having a thickness d, wherein 100 μm≦d≦600 μm.

8. The semiconductor device as claimed in one of claim 5,
wherein the coefficient of thermal expansion of the DCB material with a value of 7.1 ppm/K in the case of $Al_2O_3$ and 4.1 ppm/K in the case of AlN, in combination with ceramics, is substantially the same as the coefficient of thermal expansion of silicon.

9. The semiconductor device as claimed in claim 8,
wherein the structure of the copper layer corresponds, at least in part, to the electrodes on the top side of a power semiconductor chip and has a signal conductive track for the connection of a gate electrode and a power semiconductor track for the connection of a power electrode.

10. The semiconductor device as claimed in claim 7,
wherein a top side of the structured copper layer comprises a nickel, palladium/gold, nickel/palladium/gold or nickel/gold coating.

11. The semiconductor device as claimed in claim 1,
wherein the structure element extends between the top side of the semiconductor chip and at least two external contacts.

12. The semiconductor device as claimed in claim 11,
wherein the structure element extends between the top side of the semiconductor chip and at least two separate external contacts.

13. The semiconductor device as claimed in claim 1,
wherein the first contact of the semiconductor chip is electrically connected to at least two external contacts via a conductor track of a connecting element.

14. The semiconductor device as claimed in claim 1,
wherein the structure element has a coefficient of thermal expansion of less than 10 ppm/K.

15. The semiconductor device as claimed in claim 1,
wherein the structure element has a coating with a metal or an alloy of metals from the group Cu, Al, Ag, Au, Pd, Pt or Ni, said coating being structured to form conductor tracks and contact areas.

16. The semiconductor device as claimed in claim 1,
wherein the first contact and the second contact of the top side of the semiconductor chip, together with the associated contact areas of the structure element, form a common contact connection plane and are surface-mountable.

17. The semiconductor device as claimed in claim 1,
wherein the semiconductor device has a plastic housing in which is embedded the semiconductor chip, the structure element and surfaces of the external contacts, and wherein undersides of the external contacts are kept free of plastic housing composition.

18. The semiconductor device as claimed in claim 1,
wherein the semiconductor device has a chip carrier with a top side and a rear side, wherein the semiconductor chip is arranged on the chip carrier.

19. The semiconductor device as claimed in claim 18,
wherein the rear side of the chip carrier is freely accessible from the plastic housing composition.

20. The semiconductor device as claimed in claim 19,
wherein the rear side of the chip carrier provides an external contact of the semiconductor device.

21. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element has a preformed base part composed of plastic, which has insulating fillers and the coefficient of thermal expansion of which is adapted to a coefficient of thermal expansion of the semiconductor material of the semiconductor chip.

22. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element comprises a preformed base part composed of sintered ceramic, the coefficient of thermal expansion of which is adapted to a coefficient of thermal expansion of the semiconductor material of the semiconductor chip.

23. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element has conductor tracks and contact areas, and wherein a cross section of the conductor tracks is sufficient to accommodate a current density that flows via the contacts.

24. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the contacts of the top side of the semiconductor chip and the contact areas of the structure element have coatings with diffusion solder components for forming intermetallic phases.

25. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element has a step and a step height, wherein the step height is adapted to a thickness of the semiconductor chip.

26. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element has an obtuse-angled shoulder and a height of the shoulder is adapted to a thickness of the semiconductor chip.

27. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element has a planar connecting plate, and wherein external contacts that carry the semiconductor chip are preformed for thickness compensation.

28. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein a third contact of the semiconductor chip substantially covers the rear side as a single rear side electrode.

29. The semiconductor device as claimed in claim 28,
wherein the semiconductor device has at least one diffusion solder layer between the third contact of the semiconductor chip and an assigned chip carrier.

30. The semiconductor device as claimed in claim 29,
wherein the diffusion solder material comprises an intermetallic phase from the group AuSn, AgSn, CuSn or AgIn.

31. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the first contact is a second power electrode and the second contact is a control electrode.

32. The semiconductor device as claimed in claim 31,
wherein the second power electrode is a source electrode and the first power output electrode is a drain electrode of a vertical power MOSFET and the control electrode is an insulated gate electrode.

33. The semiconductor device as claimed in claim 31,
wherein the power MOSFET has a monolithically integrated gate driver.

34. The semiconductor device as claimed in claim 31,
wherein the first contact is an emitter electrode and a third contact is a collector electrode of a vertical IGBT (insulated gate bipolar transistor), and the second contact is an insulated gate electrode.

35. The semiconductor device as claimed in one of claim 31,
wherein the control electrode of the semiconductor chip has a vertical trench gate electrode.

36. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the structure element comprises contact areas for signal and/or supply electrodes on a top side of the semiconductor chip, which is provided with monolithically integrated control or logic circuits.

37. A semiconductor device comprising:
a semiconductor chip with at least one first contact and one second contact on its top side,
external contacts, and
connecting elements which are arranged jointly on a structure element and which connect the first contact and the second contact of the top side of the semiconductor chip to the external contacts,
wherein the semiconductor device has a cavity housing, in which the semiconductor chip, the structure element and top sides of the external contacts are arranged, and wherein undersides of the external contacts are freely accessible on the underside and/or the edge sides of the semiconductor device.

* * * * *